United States Patent [19]

Maeta et al.

[11] Patent Number: 5,677,575
[45] Date of Patent: Oct. 14, 1997

[54] SEMICONDUCTOR PACKAGE HAVING SEMICONDUCTOR CHIP MOUNTED ON BOARD IN FACE-DOWN RELATION

[75] Inventors: Hideaki Maeta; Hiroshi Iwasaki, both of Kanagawa-ken, Japan

[73] Assignee: Kabushiki Kaisha Toshiba, Kanagawa-ken, Japan

[21] Appl. No.: 655,374

[22] Filed: May 30, 1996

Related U.S. Application Data

[63] Continuation of Ser. No. 413,871, Mar. 29, 1995, abandoned.

[30] Foreign Application Priority Data

Mar. 30, 1994 [JP] Japan ..................... 6-060492
Mar. 30, 1994 [JP] Japan ..................... 6-060493

[51] Int. Cl.⁶ .................. H01L 23/48; H01L 23/52; H01L 29/40
[52] U.S. Cl. ............. 257/778; 257/783; 257/781; 257/780
[58] Field of Search ................. 257/778, 777, 257/779, 780, 781, 782, 783, 784, 786

[56] References Cited

U.S. PATENT DOCUMENTS

| | | | |
|---|---|---|---|
| 3,871,015 | 3/1975 | Lin et al. | 257/778 |
| 5,399,903 | 3/1995 | Rostoker et al. | 257/778 |
| 5,468,995 | 11/1995 | Higgins, III | 257/778 |
| 5,523,622 | 6/1996 | Harada et al. | 257/778 |

*Primary Examiner*—Mahshid D. Saadat
*Assistant Examiner*—S. V. Clark
*Attorney, Agent, or Firm*—Finnegan, Henderson, Farabow, Garrett & Dunner, L.L.P.

[57] ABSTRACT

The semiconductor package comprises a board having a wiring circuit including a connecting portion on a first main surface, a semiconductor chip mounted on the first main surface of the board in face-down relation, a resin layer filled into a space formed between a surface of the semiconductor chip and the first main surface of the board, flat type external connecting terminals electrically connected to the semiconductor chip and formed on a second main surface of the board, and a dummy wiring pattern formed at an outer-peripheral edge portion of at least one of the first main surface of the board and an inner wiring layer.

15 Claims, 3 Drawing Sheets

SEMICONDUCTOR PACKAGE HAVING SEMICONDUCTOR CHIP MOUNTED ON BOARD IN FACE-DOWN RELATION

This is a continuation of application Ser. No. 08/413,871 filed Mar. 29, 1995, now abandoned.

BACKGROUND OF THE INVENTION

1. Field of the Invention

The present invention relates to a semiconductor package, in particular, to a small and thin type semiconductor package suitable for a card type external storage medium or the like.

2. Description of the Related Art

The size (length, width, and thickness) of a memory card is limited. Thus, the semiconductor package that accommodates a memory or the like should be thinly and compactly constructed so that it almost accords with the outer shape of a semiconductor chip.

To satisfy such a thin construction (for example, requirement of a space of thickness of 1 mm or less), flip chip mounting method, COB (Chip on Board) method, and so forth are known. FIGS. 1 and 2 show examples of thin type modules. Referring to FIGS. 1 and 2, each module comprises a circuit board 1, a semiconductor chip (flip chip) 2, flat type external connecting terminals 4, and a mold resin layer 5. A wiring circuit 1a including a connecting portion is formed on a first main surface of the circuit board 1. The semiconductor chip 2 is mounted on the first main surface of the circuit board 1. The flat type external connecting terminals 4 are formed on a second main surface of the circuit board 1 via through-holes 3. The mold resin layer 5 seals and covers the mounted region of the semiconductor chip 1 and the like.

In the construction of the thin type package, when the semiconductor chip 2 with outer dimensions of for example 15×5×0.25 mm is mounted, a circuit board 1 with outer dimensions of 20×10×0.2 mm is selected. The circuit board 1 is for example composed of an insulator such as alumina or aluminum nitride. In FIG. 1, reference numeral 6 represents bonding wires. In FIG. 2, reference numeral 1b represents silver paste connecting pads formed on the connecting surface of the wiring circuit 1a. Reference numeral 2a represents connecting bumps formed on the electrode terminals of the semiconductor chip 2.

However, in the case of the flip chip mounting method and the COB method, it is difficult to provide KGN (Known Good Die). Chips cannot be easily burnt in. Since a semiconductor chip to be used cannot be burnt in advance, the reliability thereof is low. In other words, before the semiconductor chip (IC chip) is used, a defect thereof that will take place in future should be detected. This process is referred to as burn-in. Thus, without the burn-in process, after the semiconductor chip is packaged, a trouble may take place. Thus, in these methods, the reliability is low. In addition, since the COB method requires a wider mounting area than the flip chip mounting method, the resultant semiconductor package cannot be compactly constructed.

In the case of the packaged module shown in FIG. 1, in a conventional transfer mold process, the bonding wires 6 will move or the connecting portions will dislocate, thereby decreasing the reliability and yield of the final products. Moreover, at present technology, it is difficult to reduce the height of the bonding wires 6 to 0.1 mm or less. Thus, this limitation leads to a problem for fabricating thin type packages. Furthermore, to connect the bonding wires 6 to the external connecting terminals, an extra space is required outside the semiconductor chip 1, thereby preventing the package from being compactly constructed.

On the other hand, in the case of the packaged module shown in FIG. 2, in conventional sealing resin coating/filling processes, it may be difficult to solidly fill and seal the space formed between the surface of the semiconductor chip 2 and the surface of the circuit board 1 with a sealing resin. In other words, the thickness of circuit wiring 1a (including the connecting portion) formed and arranged on the first main surface of the circuit board 1 is approximately 35 μm. In other words, the circuit wiring 1a extrudes from the surface of the circuit board 1 for approximately 35 μm. In addition, since such a semiconductor package should be thinly constructed, the distance between the circuit board 1 and the semiconductor chip 2 is small. Thus, the protrusion for approximately 35 μm of the circuit wiring 1a prevents the sealing resin from being smoothly filled into the space. For example, when the sealing resin is filled into the space formed between the circuit board 1 and the semiconductor chip 2 by capillary action, the circuit wiring 1a prevents the sealing resin from being smoothly filled into the space. Thus, the sealing resin may not solidly fill the space and seal the circuit board 1 and the semiconductor chip 2. When the region is not solidly filled with the sealing resin, foam or the like tends to reside therein. Thus, when the packaged module is operated, heat generated thereby causes the foam to swell up. Consequently, the unification between the circuit board 1 and the semiconductor chip 2 will be lost. In other words, since the connecting portion tends to peel off, the reliability, yield, and so forth of the resultant semiconductor package will deteriorate.

Moreover, in the above-described constructions of the semiconductor packages, the following problem will take place. To modularize the above-described semiconductor chip, a thin (approximately, 0.2 mm) square (including rectangle) ceramic board is used as a supporting board. Since the ceramic board is relatively thin, the mechanical strength thereof is low. Thus, each corner portion of the ceramic board tends to be damaged or cracked. If the corner portions are unexpectedly damaged, it becomes difficult to align the position (or direction) of the semiconductor package (or the semiconductor module). In other words, when the semiconductor package is mounted, a particular corner thereof is intentionally cut for an alignment mark. Thus, when a corner portion is unexpectedly damaged, it cannot be distinguished from the alignment mark. Consequently, it results in a handling error.

Therefore, a first object of the present invention is to provide a semiconductor package that can be fabricated at low cost.

A second object of the present invention is to provide a semiconductor package that can be compactly constructed.

A third object of the present invention is to provide a semiconductor package that is compactly constructed with high reliability.

A fourth object of the present invention is to provide a thin type semiconductor package that is free of an alignment error of position or direction in mounting a circuit board or the like.

SUMMARY OF THE INVENTION

A first aspect of the present invention is a semiconductor package, comprising a board having a wiring circuit including a connecting portion on a first main surface, a semiconductor chip mounted on the first main surface of the board in face-down relation, a resin layer filled into a space formed between a surface of the semiconductor chip and the first main surface of the board, flat type external connecting terminals electrically connected to the semiconductor chip and formed on a second main surface of the board, and a dummy wiring pattern formed at an outer peripheral edge portion of at least one of the first main surface of the board and an inner wiring layer. Since the dummy wiring pattern is formed at the outer peripheral edge portion of the board, the thin board can be prevented from cracking and warping. In addition, the dummy wiring portion can provide so-called shield effect that prevents the semiconductor chip from being affected by noise.

A second aspect of the present invention is the semiconductor package of the first aspect, wherein the connecting portion of the board and an electrode portion of the semiconductor chip are diffused and bonded in solid phase. Thus, since the dummy wiring pattern is formed at the outer peripheral edge portion of the board, the thin board can be prevented from cracking and warping. In addition, the dummy wiring portion can provide so-called shield effect that prevents the semiconductor chip from being affected by noise. Moreover, the reliability of the board such as electrical connections and mechanical fixing of the semiconductor chip to the board is improved.

A third aspect of the present invention is the semiconductor package of the first or second aspect, wherein the dummy wiring pattern is formed at the outer peripheral edge with a predetermined width. Thus, the reliability and the like is further improved.

A fourth aspect of the present invention is a semiconductor package, comprising a board having a wiring circuit including a connecting portion on a first main surface, a semiconductor chip mounted on the first main surface of the board in face-down relation, a resin layer filled into a space formed between a surface of the semiconductor chip and the first main surface of the board, flat type external connecting terminals electrically connected to the semiconductor chip and formed on a second main surface of the board with constant pitches in a lattice shape, and a dummy wiring pattern formed at an outer peripheral edge portion of at least one of the first main surface of the board and an inner wiring layer. Thus, the board can be prevented from being externally broken and damaged. In addition, since the connections of the semiconductor socket and mounting board can be standardized, the productivity can be improved and cost can be reduced.

A fifth aspect of the present invention is the semiconductor package of the fourth aspect, wherein the connecting portion of the board and an electrode portion of the semiconductor chip are diffused and bonded in solid phase. Thus, the board can be prevented from being broken and damaged. In addition, the reliability of the board such as electrical connections and mechanical fixing of the semiconductor chip to the board is improved. Moreover, since the connections of the semiconductor socket and mounting board can be standardized, the productivity can be improved and cost can be reduced.

A sixth aspect of the present invention is the semiconductor package of the fourth or fifth aspect, wherein the dummy wiring pattern is formed at the outer peripheral edge with a predetermined width. Thus, the reliability and the like is further improved.

A seventh aspect of the present invention is a semiconductor package, comprising a board having a wiring circuit including a connecting portion on a first main surface, a semiconductor chip mounted on the first main surface of the board in face-down relation, a resin layer filled into a space formed between a surface of the semiconductor chip and the first main surface of the board, and flat type external connecting terminals electrically connected to the semiconductor chip and formed on a second main surface of the board, wherein the surface of the wiring circuit including the connecting portion which is formed on a part of the first main surface of the board and the surface of a remaining portion on which the wiring circuit is not formed, are substantially on the same level.

An eighth aspect of the present invention is the semiconductor package of the seventh aspect, wherein the flatness of the plane of the wiring circuit including the connecting portion of the first main surface to the remaining surface of the first main surface is ±10 µm. Thus, the resin sealing of the semiconductor package can be densely and easily performed. Thus, the semiconductor package can be thinly constructed with high reliability.

A ninth aspect of the present invention is the semiconductor package of the seventh or eighth aspect, further comprising a dummy wiring pattern formed at an outer peripheral edge portion of the circuit board. Thus, the semiconductor package can be thinly constructed with high reliability. In addition, the board can be prevented from being externally broken and damaged.

A tenth aspect of the present invention is the semiconductor package of the seventh aspect, wherein the flat type external connecting terminals are electrically connected to the semiconductor chip and formed on the second main surface of the board by filled-via-hole connections.

An eleventh aspect of the present invention is the semiconductor package of the tenth aspect, wherein the flatness of the plane of the wiring circuit including the connecting portion of the first main surface to the remaining surface of the first main surface of the board is ±10 µm. Thus, the semiconductor package can be thinly constructed with high reliability. In addition, the sealing resin can be more easily prevented from flowing to the rear surface than the case of the through-hole connections. Thus, the dense filling of the sealing resin layer can be easily obtained. Moreover, the thin construction and good appearance of the semiconductor package can be accomplished.

A twelfth aspect of the present invention is the semiconductor package of the tenth or eleventh aspect, further comprising a dummy wiring pattern formed at an outer peripheral edge portion of the circuit. Thus, the semiconductor package can be thinly constructed with high reliability. In addition, the board can be prevented from being externally broken and damaged.

In the first semiconductor package according to the present invention, in addition to the wiring circuit (which includes the connecting portion formed on the first main surface of the board) and the inner wiring circuit, the dummy wiring pattern is formed at the outer peripheral edge portion of the circuit board so as to surround the wiring circuit. The board is a resin type board or a ceramic type board. The semiconductor chip is mounted on the first main surface of the board. In addition, a mold sealing resin layer is not formed on the upper surface of the semiconductor chip. Thus, the semiconductor chip is compactly and thinly constructed. Moreover, the dummy wiring pattern prevents the board from warping and improves the mechanical strength thereof.

On the board that mounts the semiconductor chip, the dummy wiring pattern is formed at a non-circuit forming region at the outer peripheral edge portion that is free from the wiring circuit. In other words, the dummy wiring pattern is formed at the non-circuit forming region at the outer peripheral edge portion free from the wiring circuit (which includes the connecting portion formed on the first main surface of the board) and/or a wiring circuit formed in an internal layer with a width of for example 0.1 to 2 mm in such a manner that the dummy wiring pattern is insulated from the wiring circuit. The dummy wiring pattern is preferably formed from the outer peripheral edge with a distance of 2 mm or less. The dummy wiring pattern can be formed when the wiring circuit on the first main surface is formed or when the wiring circuit of the inner layer is formed. When the dummy wiring pattern is formed, the board can be suppressed and prevented from warping. In addition, the dummy wiring pattern can prevent the semiconductor chip from being affected by noise.

In addition to the dummy wiring pattern, when the connecting pads and the electrodes (electrode terminals) of the semiconductor chip are diffused and bonded, they can be electrically connected with higher reliability.

When the flat type external connecting terminals formed on the second surface (rear surface) of the board are arranged with constant pitches in a lattice shape, the semiconductor package can be standardized. In the case that the arrangement of the external connecting terminals are not symmetrical, when the dummy connecting terminals are formed at corner portions of the board, the flat mounting of the semiconductor package can be easily performed.

In the second semiconductor package according to the present invention, the wiring circuit including the connecting portion on the circuit board is buried and formed on the same plane as the remaining surface of the board on which the wiring circuit is not formed. The flatness of the wiring circuit is not strict. Generally, when the thickness of the wiring circuit is approximately 35 μm, the tolerance of the thickness of the wiring circuit is ±10 μm. When a ceramic type insulation material is used, the circuit board can be fabricated by green sheet method. When a resin type insulation material is used, the circuit board can be fabricated by pre-preg method.

On the board that mounts the semiconductor chip, the dummy wiring pattern is formed at a non-circuit forming region at the outer peripheral edge portion that is free from the wiring circuit. In other words, the dummy wiring pattern is formed at the non-circuit forming region at the outer peripheral edge portion free from the wiring circuit (which includes the connecting portion formed on the first main surface of the board) and/or a wiring circuit formed in an internal layer with a width of for example 0.1 to 0.2 mm in such a manner that the dummy wiring pattern is insulated from the wiring circuit. The dummy Wring pattern is preferably formed from the outer peripheral edge with a width of 2 mm or less. The dummy wiring pattern can be formed when the wiring circuit on the first main surface is formed or when the wiring circuit of the inner layer is formed. When the dummy wiring pattern is formed, the board can be suppressed and prevented from warping. In addition, the dummy wiring pattern can prevent the semiconductor chip from being affected by noise.

In addition to the dummy wiring pattern, when the connecting pads and the electrodes (electrode terminals) of the semiconductor chip are diffused and bonded, they can be electrically connected with higher reliability.

When the flat type external connecting terminals formed on the second surface (rear surface) of the board are arranged with constant pitches in a lattice shape, the semiconductor package can be standardized. In the case that the arrangement of the external connecting terminals are not symmetrical, when the dummy connecting terminals are formed at corner portions of the board, the flat mounting of the semiconductor package can be easily performed.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to FIGS. 3 to 7, embodiments of the present invention will be described.

First Embodiment

Figure 1:
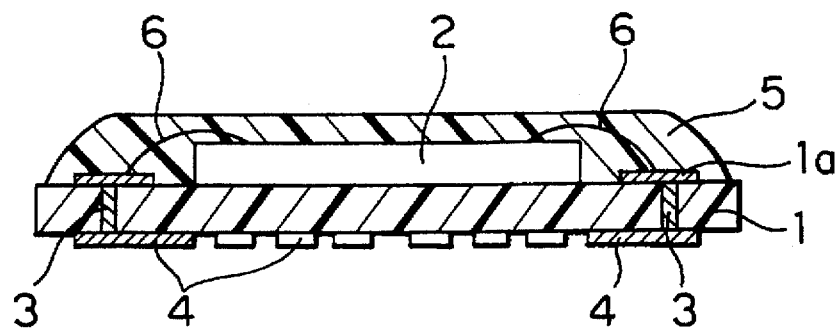
FIG. 1 is a sectional view showing a construction of principal portions of a conventional semiconductor package.
Figure 2:
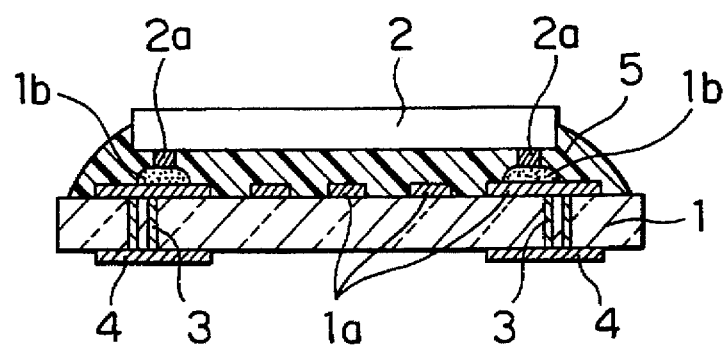
FIG. 2 is a sectional view showing a construction of principal portions of a construction of another conventional semiconductor package.
Figure 3:
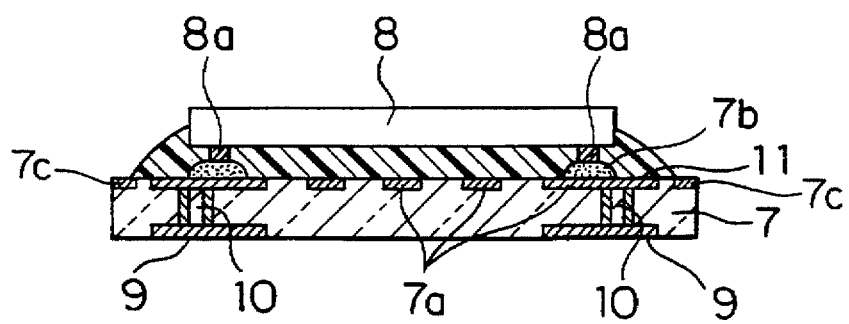
FIG. 3 is a sectional view showing a construction of principal portions of a semiconductor package according to the present invention.
Figure 4:
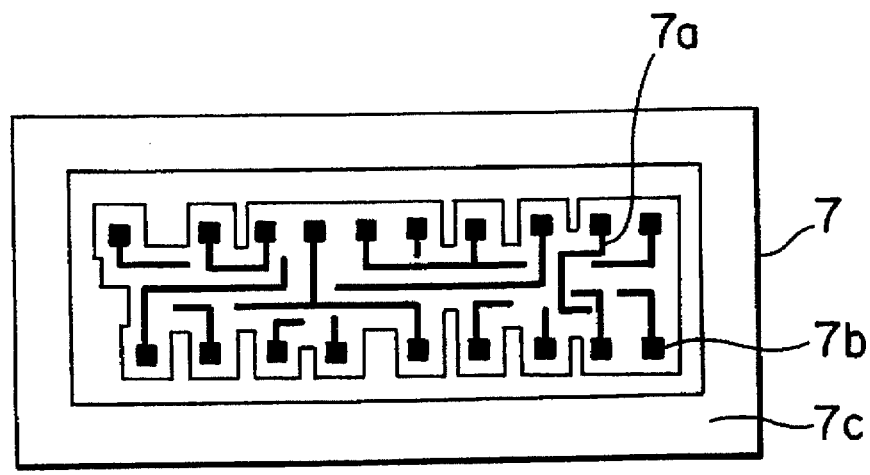
FIG. 4 is a plan view showing a pattern of a circuit board (that mounts a semiconductor chip) of a semiconductor package according to the present invention.

FIG. 3 is a sectional view showing a construction of principal portions of a semiconductor package according to the present invention. In FIG. 3, reference numeral 7 is a circuit board having a wiring circuit 7a including a connecting portion. The wiring circuit 7a is formed on a first main surface of the circuit board 7 and a dummy wiring circuit pattern 7c is formed at an outer peripheral edge portion of the circuit board 7. The length, width, and thickness of the circuit board 7 are 17 mm, 7 mm, and 0.2 mm, respectively. Reference numeral 8 is a semiconductor chip (an IC chip or the like) mounted on the first main surface of the circuit board 7. The length, width, and thickness of the semiconductor chip 8 are 15 mm, 5 mm, and 0.25 mm, respectively. FIG. 4 shows an example of a wiring circuit 7a formed on the first main surface of the circuit board 7. In FIG. 4, reference numeral 7b is a connecting portion composed of sliver paste. Reference numeral 7c is a dummy wiring pattern formed at an outer peripheral edge portion of the wiring circuit pattern 7a. In this construction, the dummy wiring pattern 7c is a wide pattern that is formed at the outer peripheral edge with a width of 2 mm or less. The circuit board 7 is generally made of alumina type board, aluminum nitride type board, glass-epoxy resin type board, BT resin type board, or the like.

Reference numeral 9 represents external connecting terminals. The external connecting terminals 9 are formed on a second main surface of the circuit board 7 via through-holes 10 of the circuit board 7 with predetermined pitches (1 mm) in a lattice shape. The diameter of each external connecting terminal 9 is 0.5 mm. A sealing resin layer 11 is filled into the space formed between the first main surface of the circuit board 7 and the lower surface of the semiconductor chip 8. The sealing resin layer 11 reinforces the unification of the circuit board 7 and the semiconductor chip 8. In FIG. 3, reference numeral 8a represents connecting bumps.

Next, an example of fabrication of the above-described semiconductor package will be described.

First, the following circuit board 7 is prepared. FIG. 4 shows the first main surface of the circuit board 7. The -circuit board 7 has a circuit wiring 7a and a wide dummy wiring pattern 7c. The circuit wiring 7a includes a connecting portion 7b that connects a flip chip. In addition, the following alumina type circuit board 7 is prepared. On a second main surface (rear surface) of the circuit board 7, flat type external connecting terminals (not shown) are formed via through-holes (not shown) with predetermined pitches in a lattice shape. The alumina type circuit board 7 is used to mount a semiconductor chip 8 in face-down relation. The length, width, and thickness of the alumina type circuit board 7 are 17 mm, 7 mm, and 0.2 mm, respectively. The length, width, and thickness of the semiconductor chip 8 are 15 mm, 5 mm, and 0.25 mm, respectively.

Thereafter, the alumina type circuit board 7 is secured on the stage of a screen printer that has a vacuum sucking mechanism. Connecting pads are formed on the connecting portion 7 of the alumina type board 7 corresponding to electrode (connecting) pads 8a of the semiconductor chip 8. In other words, a metal mask with openings (for example, 150×150 µm) corresponding to the electrode pads (for example, 100×100 µm) 8a of the semiconductor chip 8 is prepared. Silver paste (for example, particle diameter is 1 µm and viscosity is 1000 ps) is screen printed on the first main surface of the alumina type circuit board 7 with the metal mask so as to form the connecting pads 7b (diameter is 150 µm and height is approximately 80 µm) on the connecting portion. In addition, the following semiconductor chip 8 is prepared. Connecting gold bumps 8a are formed on the electrode pad surface by electroplating method. Alternatively, gold ball bumps are formed on the electrode pad surface by ball bonding method. The height, width, and length of each of the gold ball bumps are 30 µm, 100 µm, and 100 µm, respectively.

On the first main surface of the alumina type board 7, the gold bumps 8a of the semiconductor chip 8 are aligned with the connecting pads 7b and placed thereon. Thereafter, the connecting portions are pressured in such a manner that at least edge portions of the connecting bumps 8a are inserted into the connecting pads 7b. Thus, the semiconductor package is assembled. In this state, the silver paste, which composes the connecting pads 7b, is heat cured so as to bond the flip chip.

Thereafter, a resin sealing process is performed. Sealing resin (for example, epoxy resin with low viscosity) is dripped on one edge side of the exposed region of the peripheral portion of the flip chip bonding region of the alumina type board 7 and then heated at 60° to 80° C. The sealing resin is filled into the space formed between the lower surface of the semiconductor chip 8 and the upper surface (first main surface) of the alumina type board 7 from one edge side thereof by capillary action. In the resin sealing process, the resin should be satisfactorily filled into the space. In addition, part of resin 11 should be formed on the side surface of the semiconductor chip 8. After the resin sealing process, the filled resin is cured (solidified) by heat or the like. Thus, the semiconductor package as shown in FIG. 3 is obtained. When the wiring circuit 7a is buried and formed on the same plane as the first main surface of the alumina type board 7, the resin can be more easily filled into the space. In this case, the sealing resin layer 11 is more densely formed.

In the semiconductor package, the resin layer 11 causes the semiconductor chip 8 and the alumina type board 7 to be securely fixed. In addition, the resin layer 11 insulates the semiconductor chip 8 against the first main surface of the alumina type circuit board 7. On the other hand, although the upper surface of the semiconductor chip 8 is exposed to the outside, since silicon that composes the exposed surface of the semiconductor chip 8 is solid and hard, the surface thereof is well protected. Experimental results show that a problem of reliability or the like of the semiconductor package does not take place.

In addition, experimental results show the following advantages of the present invention. Since the peripheral portion of the semiconductor chip 8 is securely and solidly sealed with the resin, it is securely bonded to the alumina type board 7. Thus, the reliability of the semiconductor package is high. Moreover, since the semiconductor package is reinforced by the wide pattern 7c formed at the outer peripheral edge portion on the first main surface of the circuit board 7, although the thickness thereof is as low as 0.2 to 0.3 mm, it can be effectively prevented from cracking and warping. The semiconductor package can be fabricated with high yield. In addition, the semiconductor package can be easily handled. When the semiconductor package is used for a functional portion of a memory card, it has a resistance against noise.

Figure 5:
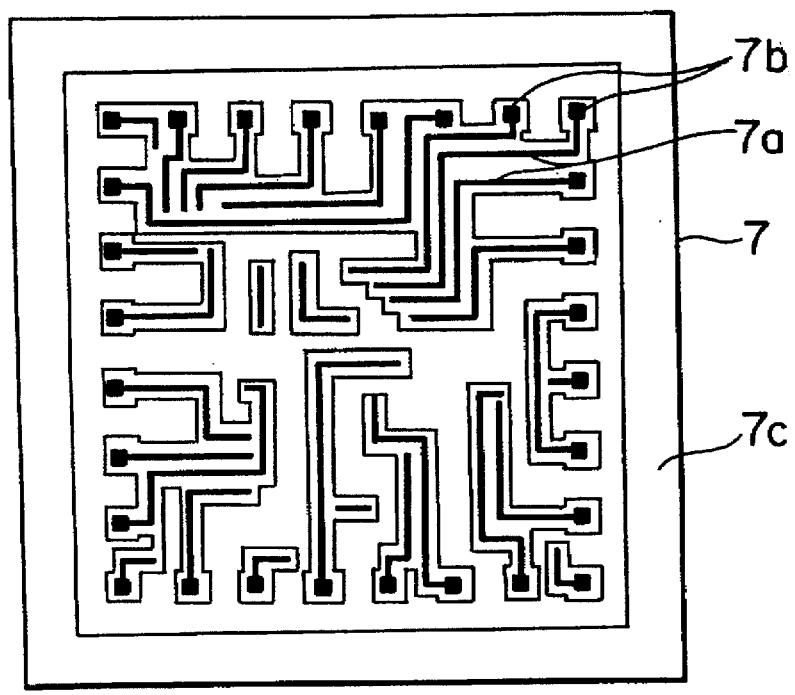
FIG. 5 is a plan view showing a pattern of another circuit board (that mounts a semiconductor chip) of a semiconductor package according to the present invention.

In the above-described embodiment, the circuit board 7 was a rectangular alumina type board. However, a circuit board 7 as shown in FIG. 5 that shows a first main surface (wiring circuit side) can be used. Alternatively, the dummy wiring pattern 7c can be formed on an inner layer of the alumina type circuit board 7. The alumina type circuit board 7 that has a circuit wiring 7a and a dummy wiring pattern 7c. The circuit wiring 7a includes a connecting portion for mounting a flip chip. On the rear surface (the second main surface) of the circuit board 7, flat type external connecting terminals (not shown) are formed via through-holes (not shown) from the circuit wiring 7a of the connecting pads 7b. Alternatively, the circuit board 7 has an inner layer on which the wide dummy wiring pattern 7c formed instead on the first main surface of the circuit board 7. In both of the constructions, the same effects can be obtained.

Second Embodiment

As shown in FIG. 4, the following alumina type board (or an aluminum nitride type board) 7 is prepared. On a first main surface of the alumina type board 7, a circuit wiring 7a and a wide dummy wiring pattern 7c are formed. The circuit wiring 7a includes a connecting portion 7b. On the rear surface (a second main surface) of the alumina type board 7, flat type external connecting terminals (not shown) are formed via through-holes (not shown) from a wiring 7a of connecting pads (having gold connecting pads) 7b with predetermined pitches in a lattice shape. In addition, the following semiconductor chip 8 is prepared. Gold bumps are formed on an electrode pad surface of the semiconductor chip 8 by electroplating method. The height, length, and width of each of the gold bumps are 30 µm, 100 µm, and 100 µm, respectively. The length, width, and thickness of the alumina type board 7 are 17 mm, 7 mm, and 0.2 mm, respectively. The length, width, and thickness of the flip chip (semiconductor chip) are 15 mm, 5 mm, and 0.25 mm, respectively. The flip chip is mounted on the alumina type board in face-down relation.

Thereafter, the alumina type board 7 and the flip chip are aligned and placed on the stage of a flip chip bonder. In other words, after the alumina type board 7 is vacuum sucked, the gold bumps on the electrode pad surface of the flip chip are aligned with the gold connecting pads 7b of the alumina type board 7 and placed thereon. While the flip chip is pressured to the alumina type board 7, they are heated at 100° to 150° C. for 30 to 120 minutes so that the connecting pads 7b and the gold bumps are diffused. Thus, the connecting pads 7b and the gold bumps are bonded and unified. Thereafter, in the same condition as the first embodiment, a sealing resin is filled into the space formed between the alumina type board 7 and the flip chip. In the resin filling process, when the temperature is raised, the capillary action is accelerated and the resin can be easily filled into the space. After the resin filling process, a heating process is performed so as to harden the filled resin. Thus, a semiconductor package of which the flip chip is fixed and held on the surface of the alumina type board 7 is fabricated.

Figure 6:
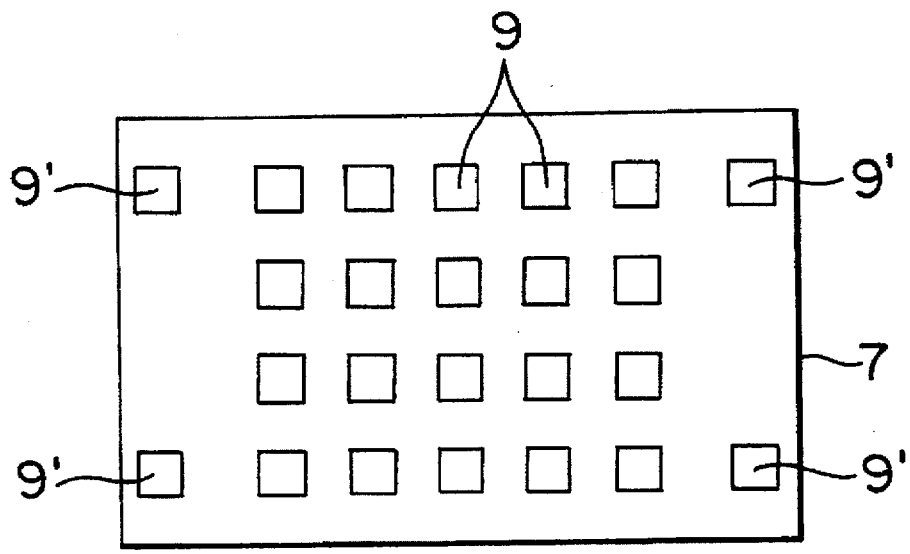
FIG. 6 is a plan view showing an arrangement of flat type external connecting terminals of a semiconductor package according to the present invention.

In the above-described construction, the flat type external connecting terminals may be randomly formed on the rear surface (second main surface) of the board 7. However, from a standardizing point of view, the flat type external connecting terminals are preferably formed with constant pitches in a lattice shape. In addition, as shown in FIG. 6, when the tolerance at the outer periphery is relatively large, dummy external connecting terminals 9' may be formed at corner portions along with the flat type external connecting terminals 9. Specifically, the lattice shape arrangement with constant pitches of the flat type external connecting terminals can be freely selected corresponding to the number of external connecting terminals. To keep the height of the rear surface of the board and improve the reliability of the connection, the dummy external connecting terminals 9' are preferably formed in a region including each corner portion that is free from the external connecting terminals 9.

Third Embodiment

The construction of a semiconductor package according to a third embodiment is similar to that shown in FIG. 3. In other words, as shown in FIGS. 3 and 4, the semiconductor package has a circuit board 7 and a semiconductor chip (an IC chip or the like) 8. The length, width, and thickness of the circuit board 7 are 20 mm, 10 mm, and 0.2 mm, respectively. The circuit board 7 has a wiring circuit 7a including a connecting portion 7b. The wiring circuit 7a is formed on a first main surface of the circuit board 7. The length, width, and thickness of the semiconductor chip 8 are 15 mm, 5 mm, and 0.25 mm, respectively. The semiconductor chip 8 is mounted on the first main surface of the circuit board 7. The wiring circuit 7a is buried and formed on the same plane of the first main surface of the circuit board 7. In addition, a connecting portion (connecting pads) 7b is formed in a region of which connecting bumps 8a on electrode terminals of the semiconductor chip 8 are connected. The connecting portion 7b is composed of silver paste. Flat type external connecting terminals 9 are buried and formed on the same plane of the rear surface of the circuit board 7 and electrically connected to the wiring circuit 7a on the first main surface via through-holes 10. The circuit board 7 is for example an alumina type circuit board, an aluminum nitride type circuit board, a glass-epoxy resin type circuit board, or a BT resin type circuit board. To prevent the circuit board 7 from warping and the semiconductor chip from being affected by noise, a dummy wiring pattern 7c is formed at an outer peripheral edge portion on the first main surface of the circuit board 7 (the outer peripheral edge portion is adjacent to the outer peripheral edge and has a width of 2 mm or less). In FIG. 3, reference numeral 11 is a resin layer that is filled into the space formed between the lower surface of the semiconductor chip 8 and the first main surface of the circuit board 7.

Next, an example of fabrication of a semiconductor package according to the third embodiment will be described.

First, the following alumina type circuit board 7 is prepared. A circuit wiring 7a and a wide dummy wiring pattern are formed on a first main surface of the alumina type circuit board 7. The circuit wiring 7a includes a connecting portion that connects a flip chip. Flat type external connecting terminals 9 are formed on the rear surface (a second main surface) of the alumina type circuit board 7 via through-holes 10 connected to the circuit wiring 7a including the connecting portion 7b in for example a lattice shape. The alumina type circuit board 7 is made of so-called green sheet method. The circuit wiring 7a (including the connecting portion) and the flat type external connecting terminals 9 are buried and formed on the same plane of the main surfaces of the alumina type circuit board 7. The alumina type circuit board 7 mounts the semiconductor chip 8 in face-down relation. The length, width, and thickness of the alumina type circuit board 7 are 20 mm, 10 mm, and 0.2 mm, respectively. The length, width, and thickness of the semiconductor chip 8 are 15 mm, 5 mm, and 0.25 mm, respectively.

Thereafter, the alumina type circuit board 7 is secured on the stage of a screen printer having a vacuum sucking mechanism. Connecting pads 7b that compose a connecting portion on the alumina type board 7 are formed corresponding to the electrode (connecting) pads 8a of the semiconductor chip 8. In other words, with a metal mask having openings (for example, 150×150 µm) corresponding to electrode pads (for example, 100×100 µm) 8a of the semiconductor chip 8, silver paste (for example, particle diameter is 1 µm and viscosity is 1000 ps) is screen-printed on the first main surface of the alumina type circuit board 7 so as to form connecting pads 7b on the connecting terminal portion. The diameter and height of each of the connecting pads are 150 µm and approximately 80 µm, respectively.

Next, the semiconductor chip 8 is prepared. On the electrode terminal surface of the semiconductor chip 8, gold bumps are formed by an electroplating process. Alternatively, gold ball bumps are formed by ball bonding method. The height, length, and width of the gold ball bumps are for example 30 µm, 100 µm, and 100 µm, respectively.

On the first main surface of the alumina type board 7, the connecting pads thereof are aligned with the connecting gold bumps 8a of the semiconductor chip 8 and placed thereon. Thereafter, the connecting portions of the alumina type board 7 and the semiconductor chip 8 are pressured. Thus, at least the edge portions of the connecting bumps are inserted into the connecting pads. Consequently, the connecting pads and the connecting bumps are connected and thereby a semiconductor package is assembled. In this state, silver paste that composes the connecting pads is cured by heat. Thus, the flip chip is bonded.

Thereafter, a resin sealing process is performed using a sealing resin. The sealing resin (for example, epoxy resin with low viscosity) is dripped on one edge side of the exposed region of the peripheral portion of the flip chip bonding region of the alumina type circuit board 7 and then heated at 60° to 80° C. The sealing resin is filled into the space formed between the lower surface of the semiconductor chip 8 and the upper surface (first main surface) of the alumina type circuit board 7 from one edge side thereof by capillary action. In the resin sealing process, the resin should be satisfactorily filled into the space. In addition, part of resin 11 should be formed on the side surface of the semiconductor chip 8. After the resin sealing process, the filled resin is hardened (solidified) by heat or the like. Thus, the semiconductor package as shown in FIG. 3 is obtained.

In the semiconductor package, the resin layer 11 causes the semiconductor chip 8 and the alumina type board 7 to be securely fixed. In addition, the resin layer 11 insulates the semiconductor chip 8 against the first main surface of the alumina type circuit board 7. On the other hand, although the upper surface of the semiconductor chip 8 is exposed to the outside, since silicon that composes the exposed surface of the semiconductor chip 8 is solid and hard, the surface thereof is well protected. Experimental results show that a problem of reliability or the like of the semiconductor package does not take place.

In addition, experimental results show the following advantages of the present invention. Since the peripheral portion of the semiconductor chip 8 is securely and densely sealed with the resin, it is securely bonded to the alumina type board 7. Thus, the reliability of the semiconductor package is high. Moreover, since the semiconductor package is reinforced by the wide pattern 7c formed at the outer peripheral edge portion on the first main surface of the circuit board 7, although the thickness thereof is as low as 0.2 to 0.3 mm, it can be effectively prevented from cracking and warping. The semiconductor package can be fabricated with high yield. In addition, the semiconductor package can be easily handled. When the semiconductor package is used for a functional portion of a memory card, it has a resistance against noise.

In the third embodiment, the circuit board 7 was a rectangular alumina type board. However, the circuit board 7 may be a square alumina type board.

As described above, according the semiconductor package of the present invention, since the dummy wiring pattern is formed at the outer peripheral edge portion of the thin circuit board on which the semiconductor chip is mounted, the circuit board can be easily suppressed from cracking and warping. In addition, the semiconductor package has so-called shield effect that prevents the semiconductor chip from being affected by noise. Moreover, the semiconductor chip is easily packaged by the resin layer, which is filled into the space formed between the semiconductor chip and the circuit board. Thus, the protection and stability (reliability) of the semiconductor chip can be improved. Furthermore, the semiconductor package can be thinly and compactly constructed. In addition to the dummy wiring pattern formed at the outer peripheral edge portion of the circuit board, when electric connections are diffused and bonded, the board can be suppressed and prevented from being broken and damaged. Moreover, the reliability of the board is improved. Furthermore, the electric connections and mechanical fixing of the semiconductor chip to the circuit board are more securely performed. Thus, the reliability is further improved. When the external connecting terminals are formed with constant pitches in a lattice shape, the breakage, damage, and so forth of the circuit board can be suppressed and prevented. Thus, the reliability is improved. In addition, the connections of the semiconductor sockets and mounting circuit boards can be standardized. Thus, the productivity can be improved and the cost can be reduced. When the dummy connecting terminals are formed, the semiconductor package can be easily aligned with the circuit board and mounted thereon. In addition, electric connections of the semiconductor package and the circuit board can be securely made. Thus, the present invention provides many practical advantages.

Fourth Embodiment

Figure 7:
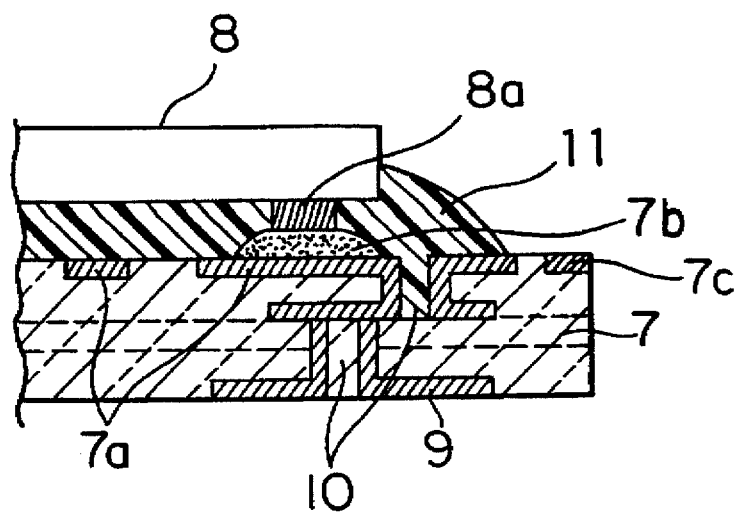
FIG. 7 is a sectional view showing a construction of another semiconductor package according to the present invention.

FIG. 7 is a sectional view showing a construction of principal portions of a semiconductor package according to a fourth embodiment of the present invention. In this embodiment, the following circuit board 7' that is an aluminum type circuit board (or an aluminum nitride type circuit board) 7' having an inner wiring layer is prepared. On a first main surface of the alumina type circuit board 7', sliver paste type connecting pads 7b that connects a flip chip are formed, further a dummy wiring pattern 7c is formed at an outer peripheral edge portion on the first main surface of the circuit board 7'.

On the rear surface (a second main surface) of the aluminum type circuit board 7', flat type external connecting terminals 9 are formed in a lattice shape through filled-via-holes 10' connected the circuit wiring 8a as shown in FIG. 7. The circuit wiring 7a (including the circuit board 7') and the flat type external connecting terminals 9 are buried and formed in the same plane as the second main surface of the circuit board 7'.

In addition, the following semiconductor chip 8 is prepared. Gold bumps 8a are formed on an electrode pad surface of the semiconductor chip 8 by electroplating method. The height, length, and width of each of the gold bumps 8a are 30 μm, 100 μm, and 100 μm, respectively. The length, width, and thickness of the alumina type board 7' are 20 mm, 10 mm, and 0.2 mm, respectively. The length, width, and thickness of the flip chip (semiconductor chip) 8 are 15 mm, 5 mm, and 0.25 mm, respectively. The flip chip is mounted on the alumina type board 7' in face-down relation.

Thereafter, the alumina type board 7' and the flip chip 8 are aligned and placed on the stage of a flip chip bonder. In other words, after the alumina type board 7' is vacuum sucked, the gold bumps 8a on the electrode pad surface of the flip chip 8 are aligned with silver of the alumina type board 7' and placed thereon. While the flip chip is pressured to the alumina type board 7', they are heated at 100° to 150° C. for 30 to 120 minutes so that the connecting pads 7b and the gold bumps 8a are diffused. Thus, the connecting pads 7b and the gold bumps 8a are bonded and unified.

Thereafter, in the same condition as the first embodiment, a sealing resin is filled into the space formed between the alumina type board 7' and the flip chip 8. In the resin filling process, when the temperature is raised, the capillary action is accelerated and the resin can be easily filled into the space. After the resin filling process, a heating process is performed so as to cure the filled resin. Thus, a semiconductor package of which the flip chip 8 is fixed and held on the surface of the alumina type board 7' is fabricated.

In the above-described construction, the flat type external connecting terminals 9 may be randomly formed on the rear surface (second main surface) of the circuit board 7'. However, from a standardizing point of view, the flat type external connecting terminals are preferably formed with constant pitches in a lattice shape. In addition, when the tolerance at the outer periphery is relatively large, dummy external connecting terminals 9' may be formed at corner portions along with the flat type external connecting terminals 9.

As described above, according the semiconductor package of the present invention, since the dummy wring pattern is formed at the outer peripheral edge portion of the thin circuit board on which the semiconductor chip is mounted, the circuit board can be easily suppressed from cracking and warping. In addition, the semiconductor package has so-called shield effect that prevents the semiconductor chip from being affected by noise. Moreover, the semiconductor chip is easily packaged by the resin layer, which is filled into the space formed between the semiconductor chip and the circuit board. Thus, the protection and stability (reliability) of the semiconductor chip can be improved. Furthermore, the semiconductor package can be thinly and compactly constructed.

In addition to the dummy wiring pattern formed at the outer peripheral edge portion of the circuit board, when electric connections are diffused and bonded, the board can be suppressed and prevented from being broken and damaged. Moreover, the reliability of the board is improved. Furthermore, the electric connections and mechanical fixing of the semiconductor chip to the circuit board are more securely performed. Thus, the reliability is further improved.

When the external connecting terminals are formed with constant pitches in a lattice shape, the breakage, damage, and so forth of the circuit board can be suppressed and prevented. Thus, the reliability is improved. In addition, the connections of the semiconductor sockets and mounting circuit boards can be standardized. Thus, the productivity can be improved and the cost can be reduced. When the dummy connecting terminals are formed, the semiconductor package can be easily aligned with the circuit board and mounted thereon. In addition, electric connections of the semiconductor package and the circuit board can be securely made. Thus, the present invention provides many practical advantages.

According to the semiconductor package of which the wiring circuit including the connecting portion is buried in the circuit board that mounts the semiconductor chip, the sealing resin layer can be securely and densely filled into the space formed between the circuit board and the semiconductor chip. In other words, since the space formed between the semiconductor chip surface and the circuit board surface is flat, the sealing resin can be easily filled into the space. Thus, the sealing layer free of voids can be easily and densely formed. Consequently, the semiconductor package can be sealed and bonded with high reliability.

In addition, when the flat type external connecting terminals are formed on the second main surface of the board by the filled-via-hole connections, the sealing resin can be more easily prevented from flowing to the rear surface than the case of the through-hole connections. Thus, the densification of the sealing resin layer can be easily obtained. In addition, the thin construction and good appearance of the semiconductor package can be accomplished. Moreover, since the semiconductor package according to the present invention has many advantages such as high reliability, thin construction, and detachability, it is suitable for a memory card and so forth.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor package, comprising:

a board having a wiring circuit including a connecting portion on a first main surface;

a semiconductor chip mounted on the first main surface of said board in face-down relation;

a resin layer filled into a space formed between a surface of said semiconductor chip and the first main surface of said board;

flat type external connecting terminals electrically connected to said semiconductor chip and formed on a second main surface of said board; and a dummy wiring pattern formed along an outer peripheral edge portion of at least one of the first main surface of said board and an inner wiring layer of said board, the dummy wiring pattern surrounding an inner area of the board.

2. The semiconductor package as set forth in claim 1, wherein the connecting portion of said board and an electrode portion of said semiconductor chip cover a part of said outer peripheral edge portion that is significant for shielding.

3. The semiconductor package as set forth in claim 1 or 2, wherein said dummy wiring pattern lies along the outer peripheral edge with a width of 2 mm or less.

4. A semiconductor package, comprising:

a board having a wiring circuit including a connecting portion on a first main surface;

a semiconductor chip mounted on the first main surface of said board in face-down relation;

a resin layer filled into a space formed between a surface of said semiconductor chip and the first main surface of said board;

flat type external connecting terminals electrically connected to said semiconductor chip and formed on a second main surface of said board with constant pitches in a lattice shape; and a dummy wiring pattern formed along an outer peripheral edge portion of at least one of the first main surface of said board and an inner wiring layer, the dummy wiring pattern surrounding an inner area of the board.

5. The semiconductor package as set forth in claim 4, wherein the connecting portion of said board and an electrode portion of said semiconductor chip cover a part of said outer peripheral edge portion that is significant for shielding.

6. The semiconductor package as set forth in claim 4 or 5, wherein said dummy wiring pattern is formed along the outer peripheral edge with a width of 2 mm or less.

7. A semiconductor package, comprising:

a board having a wiring circuit including a connecting portion and a dummy non-connecting portion on a first main surface;

a semiconductor chip mounted on the first main surface of said board in face-down relation;

a resin layer filled into a space formed between a surface of said semiconductor chip and the first main surface of said board; and flat type external connecting terminals electrically connected to said semiconductor chip and formed on a second main surface of said board, wherein the wiring circuit including the connecting portion formed on a wiring portion of the first main surface of said board is substantially formed on the same plane as said dummy non-connecting portion of the first main surface of said board.

8. The semiconductor package as set forth in claim 7, wherein the flatness of the plane of the wiring circuit including the connecting, portion of the first main surface to that of the dummy non-connecting portion of the first main surface of said board is ±10 μm.

9. The semiconductor package as set forth in claim 7 or 8, wherein the dummy non-connecting portion comprises a dummy wiring pattern formed along an outer peripheral edge portion of said circuit, the dummy wiring pattern surrounding an inner area of the board.

10. The semiconductor package as set forth in claim 7, wherein said flat type external connecting terminals are electrically connected to said semiconductor chip and formed on the second main surface of said board by filled-via-hole connections.

11. The semiconductor package as set forth in claim 10, wherein the flatness of the plane of the wiring circuit including the connecting portion of the first main surface to that of the dummy non-connecting portion of the first main surface of said board is ±10 μm.

12. The semiconductor package as set forth in claim 10 or 11, wherein the dummy non-connecting portion comprises a dummy wiring pattern formed along an outer peripheral edge portion of said circuit, the dummy wiring pattern surrounding an inner area of the board.

13. A semiconductor package, comprising:
a board having a wiring circuit including a connecting portion on a first main surface;
a semiconductor chip mounted on the first main surface of said board in face-down relation;
a resin layer filled into a space formed between a surface of said semiconductor chip and the first main surface of said board;
flat type external connecting terminals electrically connected to said semiconductor chip and formed on a second main surface of said board; and
a dummy wiring pattern formed along an outer peripheral edge portion of at least one of the first main surface of said board and an inner wiring layer of said board so that the dummy wiring pattern prevents the semiconductor chip from being affected by noise.

14. A semiconductor package, comprising:
a board having a wiring circuit including a connecting portion on a first main surface;
a semiconductor chip mounted on the first main surface of said board in face-down relation;
a resin layer filled into a space formed between a surface of said semiconductor chip and the first main surface of said board;
flat type external connecting terminals electrically connected to said semiconductor chip and formed on a second main surface of said board with constant pitches in a lattice shape;
a dummy wiring pattern formed along an outer peripheral edge portion of at least one of the first main surface of said board and an inner wiring layer of said board so that the dummy wiring pattern prevents the semiconductor chip from being affected by noise.

15. A semiconductor package, comprising:
a board having a wiring circuit including a connecting portion on a first main surface;
a semiconductor chip mounted on the first main surface of said board in face-down relation, the semiconductor chip having a connecting portion on a surface which is opposed to the first main surface of the board;
connecting bumps connecting the connecting portion of the board and the connecting portion of the semiconductor chip, and all of connecting bumps being of like size and of like material;
a resin layer filled into a space formed between a surface of said semiconductor chip and the first main surface of said board;
flat type external connecting terminals electrically connected to said semiconductor chip and formed on a second main surface of said board; and
a dummy wiring pattern formed along an other peripheral edge portion of at least one of the first main surface of said board and an inner wiring layer of said board.

* * * * *